(12) United States Patent  (10) Patent No.: US 8,542,531 B2
Franklin et al.  (45) Date of Patent: Sep. 24, 2013

(54) CHARGE EQUILIBRIUM ACCELERATION IN A FLOATING GATE MEMORY DEVICE VIA A REVERSE FIELD PULSE

(75) Inventors: Nathan R. Franklin, San Mateo, CA (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 191 days.

(21) Appl. No.: 12/829,729

(22) Filed: Jul. 2, 2010

(65) Prior Publication Data

US 2012/0002482 A1  Jan. 5, 2012

(51) Int. Cl.
G11C 11/34 (2006.01)
(52) U.S. Cl.
USPC ............ 365/185.18; 365/185.19; 365/185.22; 365/185.28
(58) Field of Classification Search
USPC .............. 365/185.18, 185.19, 185.22, 185.28
See application file for complete search history.

(56) References Cited

U.S. PATENT DOCUMENTS

| 6,438,022 | B2 * | 8/2002 | Schlosser et al. ............. 365/145 |
| 6,859,381 | B2 * | 2/2005 | Ohtsuka et al. ............... 365/145 |
| 7,177,197 | B2 * | 2/2007 | Cernea ...................... 365/185.25 |
| 7,206,235 | B1 * | 4/2007 | Lutze et al. ................... 365/195 |
| 7,468,913 | B2 * | 12/2008 | Kawamura et al. ...... 365/185.18 |
| 2009/0052269 | A1 | 2/2009 | Moschiano et al. |
| 2010/0046300 | A1 | 2/2010 | Sarin et al. |

* cited by examiner

*Primary Examiner* — Son Dinh
(74) *Attorney, Agent, or Firm* — Cool Patent, P.C.

(57) ABSTRACT

Methods for accelerating charge equilibrium in a non-volatile memory device using floating gate memory cells are disclosed. Memory devices and storage systems using charge equilibrium acceleration are also disclosed. In one such method, a programming pulse is applied to the word line to change an amount of charge stored on the floating gate of the memory cells being programmed. A reverse field pulse is then applied to the memory cell using only voltages greater than or equal to about 0 volts. The reverse field pulse accelerates charge equilibrium by moving any electrons trapped in the insulating oxide layers to a stable location so that the threshold voltage is stabilized. After the reverse field pulse, a program verify operation is performed and additional programming pulses and reverse field pulses are applied as needed to properly program the memory cell.

20 Claims, 6 Drawing Sheets

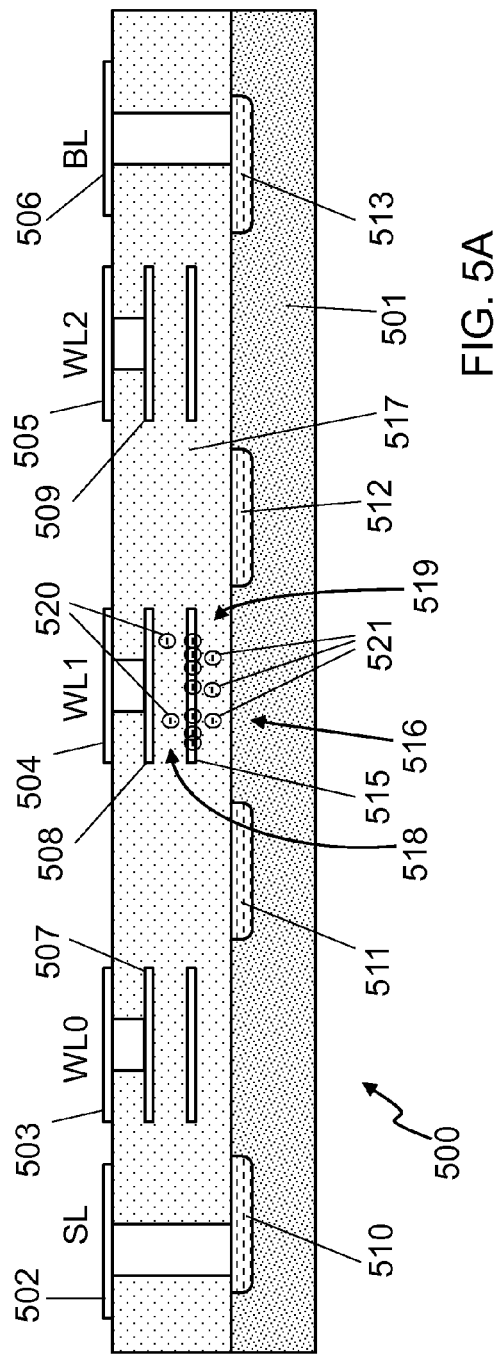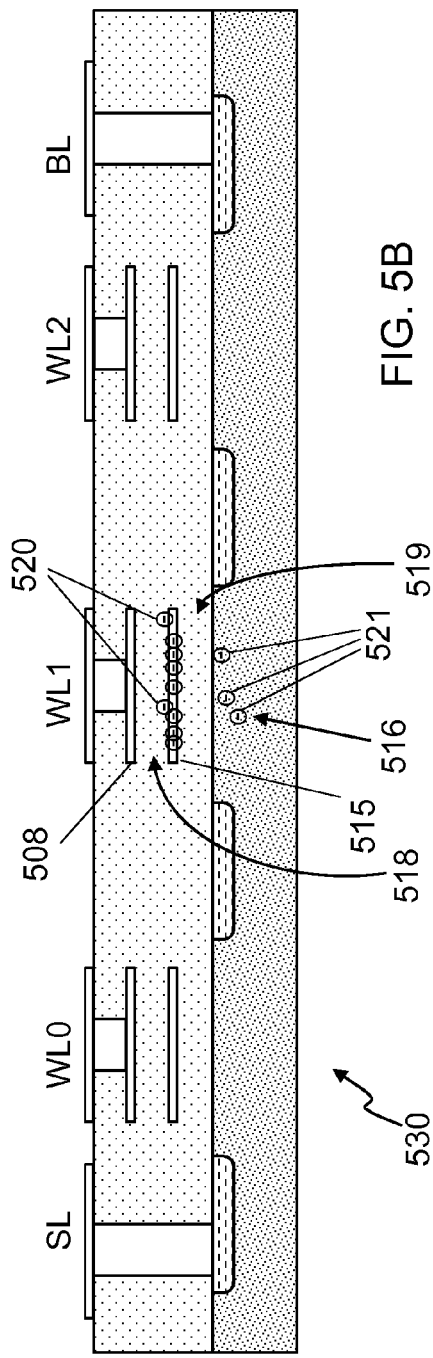

CHARGE EQUILIBRIUM ACCELERATION IN A FLOATING GATE MEMORY DEVICE VIA A REVERSE FIELD PULSE

BACKGROUND

Floating gate memory devices such as flash memory devices typically utilize a metal oxide semiconductor field effect transistor (MOSFET) having an added, isolated, floating gate between the control gate and the MOSFET channel. During programming, a charge is placed on the floating gate to change the threshold voltage (Vt) of the transistor. To read the contents of the cell, a voltage level may be placed on the control gate between the expected Vt values for different levels of charge, and the value stored in the cell may be determined by whether or not the transistor conducts. Traditionally, flash memory devices stored a single bit per cell (called single-level cells or SLC). Many modern flash memory devices use multi-level cell (MLC) technology where multiple bits are stored in a single floating gate MOSFET, sometimes called a cell, by storing differing amounts of charge on the floating gate. The cell is programmed by biasing it with a voltage pulse followed by a verification pulse to read back the contents of the cell to determine if the threshold level (Vt) of the cell has increased to the desired level. If it hasn't, another programming pulse may be sent to the cell with a higher voltage followed by another verify cycle. This repeats until the cell has the desired Vt.

Many flash memory devices include extra bits of information that are used to hold error correction code (ECC) bits because some cells may be defective for some reason such as losing their charge at a very high rate, rendering them useless for long term non-volatile memory purposes. By storing ECC bits along with the data, data from some number of bad cells may be recovered, allowing for much higher device yields.

However, even good cells may experience charge change immediately after programming. In such a situation, milliseconds of time may elapse before the electrons that were trapped in the oxide layers around the floating gate to migrate to a stable location. Once the electrons have reached a final stable state, the cell is said to have reached charge equilibrium. Because it can take a long time for the cell to reach charge equilibrium, the verify cycle is usually performed long before charge equilibrium is reached. Quick Charge Gain (QCG) may refer to the condition where charge on the floating gate increases for some time after the programming pulse. In this case, Vt may be lower than its long term state when the verify cycle reads the cell This situation may lead to an extra programming pulse being applied to the cell, thereby causing the cell to be overcharged over the long term. Quick Charge Loss (QGL) may refer to the condition where charge on the floating gate decreases for some time after the programming pulse. In such a case, Vt may be higher than its long term state when the verify cycle reads the cell which may lead to the cell not receiving another programming pulse. As a result, the cell may be undercharged over the long term. To compensate for these effects, the target Vt distribution may be enlarged in order to accommodate all possible threshold voltages for a given state.

DESCRIPTION OF THE DRAWING FIGURES

Claimed subject matter is particularly pointed out and distinctly claimed in the concluding portion of the specification. However, such subject matter may be understood by reference to the following detailed description when read with the accompanying drawings in which:

FIG. 5A and FIG. 5B are diagrams illustrating charge movement between two views of a cross section of a portion of a physical embodiment of the memory array in accordance with one or more embodiments;

Figure 1:
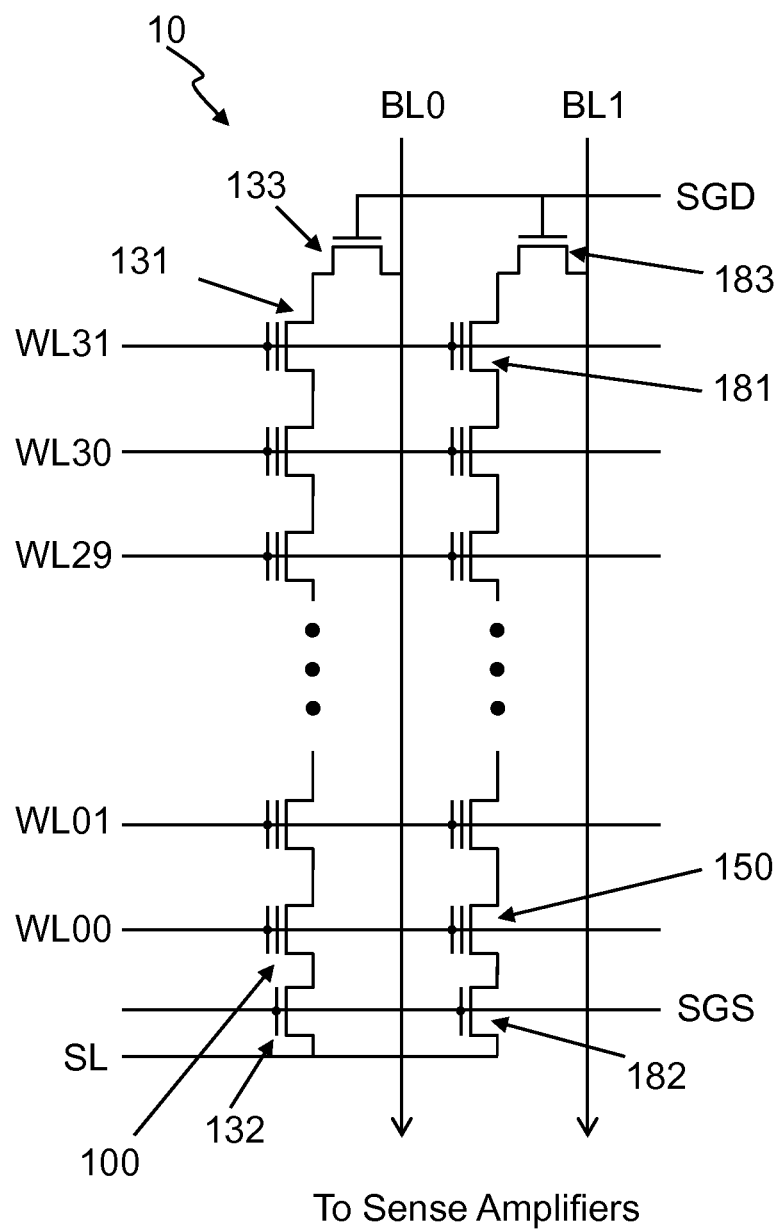
FIG. 1 is a schematic diagram of a portion of a memory array in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1, a schematic diagram of one embodiment of a portion of a memory array in accordance with one or more embodiments will be discussed. As shown in FIG. 1, memory array 10 may comprise series strings of non-volatile memory cells to which acceleration of charge equilibrium may be applied. While the subsequent discussions refer to a NAND type memory device, the methods and apparatuses described herein are not limited to such an architecture, but may be utilized in other memory device architectures as well such as NOR type devices, and the scope of the claimed subject matter is not limited in this respect.

Array 10 comprises non-volatile memory cells 100-131, 150-181, wherein the cells comprise a control gate, a channel between a source and a drain, and an electrically isolated floating gate located between the control gate and the channel. The memory cells may be arranged in columns such as series strings 100-131, 150-181. The cells in each string 100-131, 150-181 may be coupled to each other in a drain to source arrangement. A word line, or an access line, WL00-WL31 may be connected to the control gate of a respective memory cell in many different strings of memory cells to apply an electric field to those memory cells. In the embodiment shown in FIG. 1, a word line may be connected to a memory cell in the first string and to another memory cell in the second string. In such an arrangement, word line WL00 may be connected to the control gate of a memory cell 100 in the first string and a memory cell 150 in the second string. Similarly, word line WL31 may be connected to the control gate of a memory cell 131 in the first string and a memory cell 181 in the second string. Bit lines, or data lines, BL0, BL1 may be coupled to the strings and ultimately connected to sense amplifiers (not shown) that detect the state of the cells by sensing current on a particular bit line. In some embodiments, a large number of memory cells on the order of billions of memory cells in the array may be organized with many word lines and bit lines going through the array, although the scope of the claimed subject matter is not limited in this respect.

The series of strings 100-131 and 150-181 of memory cells may be coupled to a source line SL by a source select gate 132 and 182 and to an individual bit line BL0, BL1 by a drain select gate 133,183. The source select gates 132 and 182 may be controlled by a source select gate control line SGS. The drain select gates 133,183 are controlled by a drain select gate control line SGD. In one or more embodiments, array 10 of memory cells may be part of a memory device of a storage system, an example of which is shown in and described with respect to FIG. 2, below.

Figure 2:
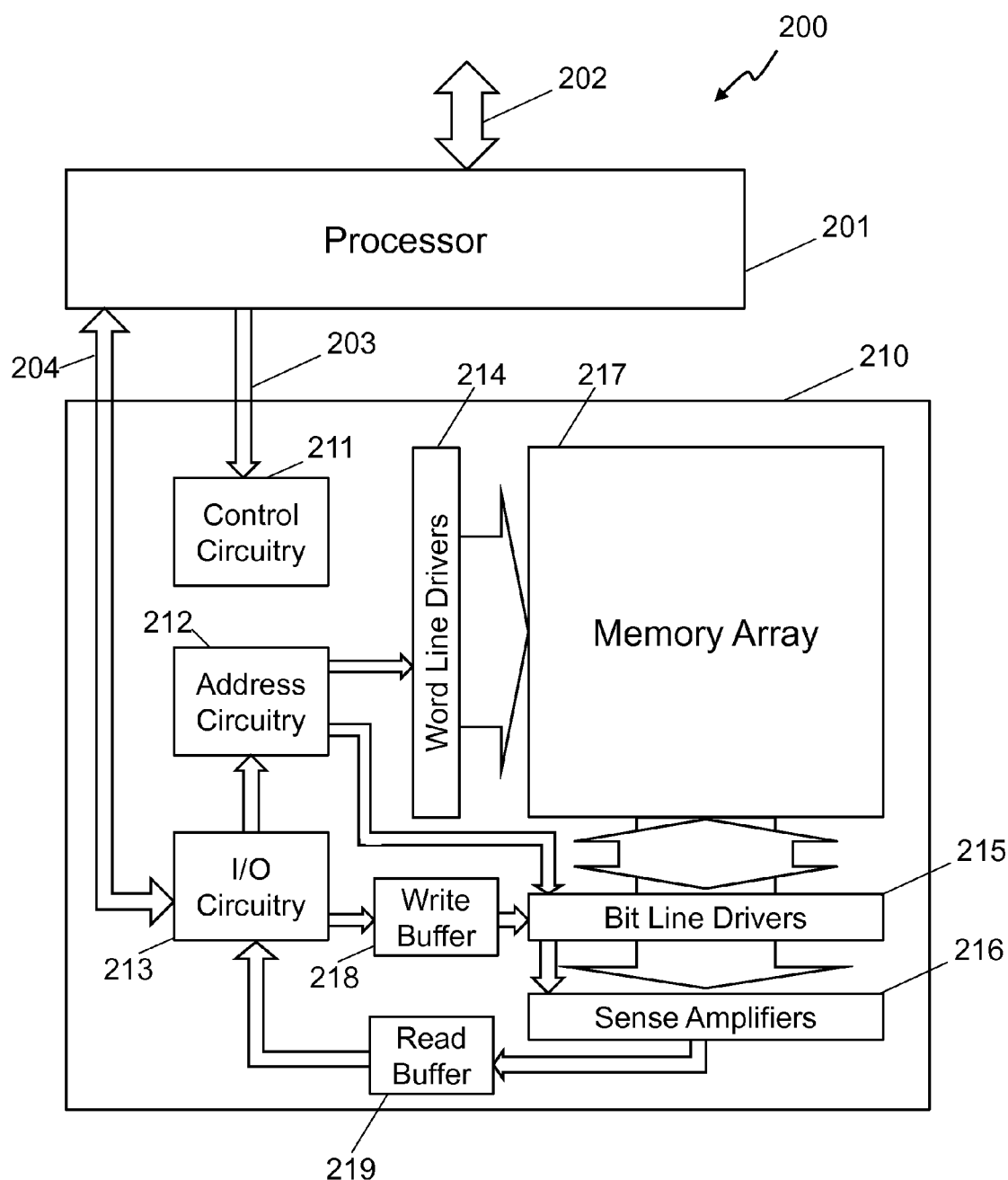
FIG. 2 is a block diagram of a storage system utilizing a memory device in accordance with one or more embodiments.

Referring now to FIG. 2, a block diagram of an embodiment of a storage system utilizing a memory device in accordance with one or more embodiments will be discussed. As shown in FIG. 2, storage system 200 may comprise a processor 201 coupled to a memory device 210 with control lines 203 and data lines 204. In some embodiments, data and control may utilize the same lines. The processor 201 may comprise an external microprocessor, microcontroller, or some other type of external controlling circuitry or logic, and the scope of the claimed subject matter is not limited in this respect. In some embodiments, the processor 201 may be integrated in the same package or on the same die as the memory device 210. In some embodiments, processor 201 may be integrated with the control circuitry 211 allowing some of the same circuitry to be used for both functions. The processor 201 may have external memory, such as random access memory (RAM) and/or read-only memory (ROM) to storage of program instructions and/or intermediate data, or alternatively processor 201 may have at least some internal RAM or ROM. In some embodiments, processor 201 may use memory device 210 for program and/or data storage. A program running on processor 201 may implement many different functions including, but not limited to, a standard file system, a flash file system, write leveling, bad cell or block mapping, and error management The storage system 200 has been simplified to focus on features of the memory that are helpful in understanding this disclosure.

In some embodiments, an external connection 202 may be provided, wherein external connection 202 may be coupled to processor 201 to allow the processor 201 to communicate to devices external to the memory subsystem to provide the external device with non-volatile storage. The external connection 202 may be used to connect to a computer or other electronic device such as a cell phone or digital camera using a standard or proprietary communication protocol. Examples of communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCIe), however the scope of the claimed subject matter is not limited in these respects.

The memory device 210 may include an array 217 of non-volatile memory cells, such as shown in and described with respect to FIG. 1, above. The memory array 217 may be arranged in banks of word line rows and bit line columns. In one embodiment, the columns of the memory array 217 may be comprised of series strings of memory cells. The connections of the cells to the bit lines may determine if the array 10 comprises NAND architecture, AND architecture, and/or a NOR architecture, or combinations thereof.

Address buffer circuitry 212 may be provided to latch address signals provided through the I/O circuitry 213. Address signals may be received and decoded by word line drivers 214 and bit line drivers 215 to access the memory array 217. In some embodiments, the number of address input connections may depend on the density and/or architecture of the memory array 217 wherein the number of addresses increases with increased memory cell counts and/or increased bank and block counts.

The memory device 210 may read data in the memory array 217 by sensing voltage or current changes in the memory array columns using sense amplifier circuitry 216. In one embodiment, the sense amplifier circuitry 216 may be coupled to read and latch a row of data from the memory array 217. Write buffers 218 may be used in some embodiments to accumulate data until a write can be performed and read buffers 219 may hold data read from the memory array 217 until it can be set out through the data lines 204. The I/O circuitry 213 routes the data through the I/O pins of the memory device 210.

Memory control circuitry 211 decodes commands provided on control lines 203 from the processor 201. These commands may be utilized to control the operations on the memory array 217, including data read, data write (program), and/or erase operations. The memory controller circuitry 211 may comprise a state machine, a sequencer, a processor, and/or some other type of controller to generate the voltage waveforms necessary to control the memory array 217. The control circuitry 211 communicates with the other blocks in the memory device but those connections are not shown as they would overly complicate the block diagram 200 and one skilled in the art can understand that the control circuitry 211 has numerous interconnections with the other blocks in order to control their functions. In one embodiment, the memory control circuitry 211 may be configured to execute the programming method of the present embodiments in order to accelerate charge equilibrium in the memory device. Although the flash memory device illustrated in FIG. 2 has been simplified to facilitate a basic understanding of the features and operation of the memory, many different embodiments may be realized, for example wherein a single processor may be utilized 202 to control a plurality of memory devices 210 to provide for more storage space. In one or more embodiments, the memory device of FIG. 2 may utilize accelerated charge equilibrium as shown in and described with respect to FIG. 3, below.

Figure 3:
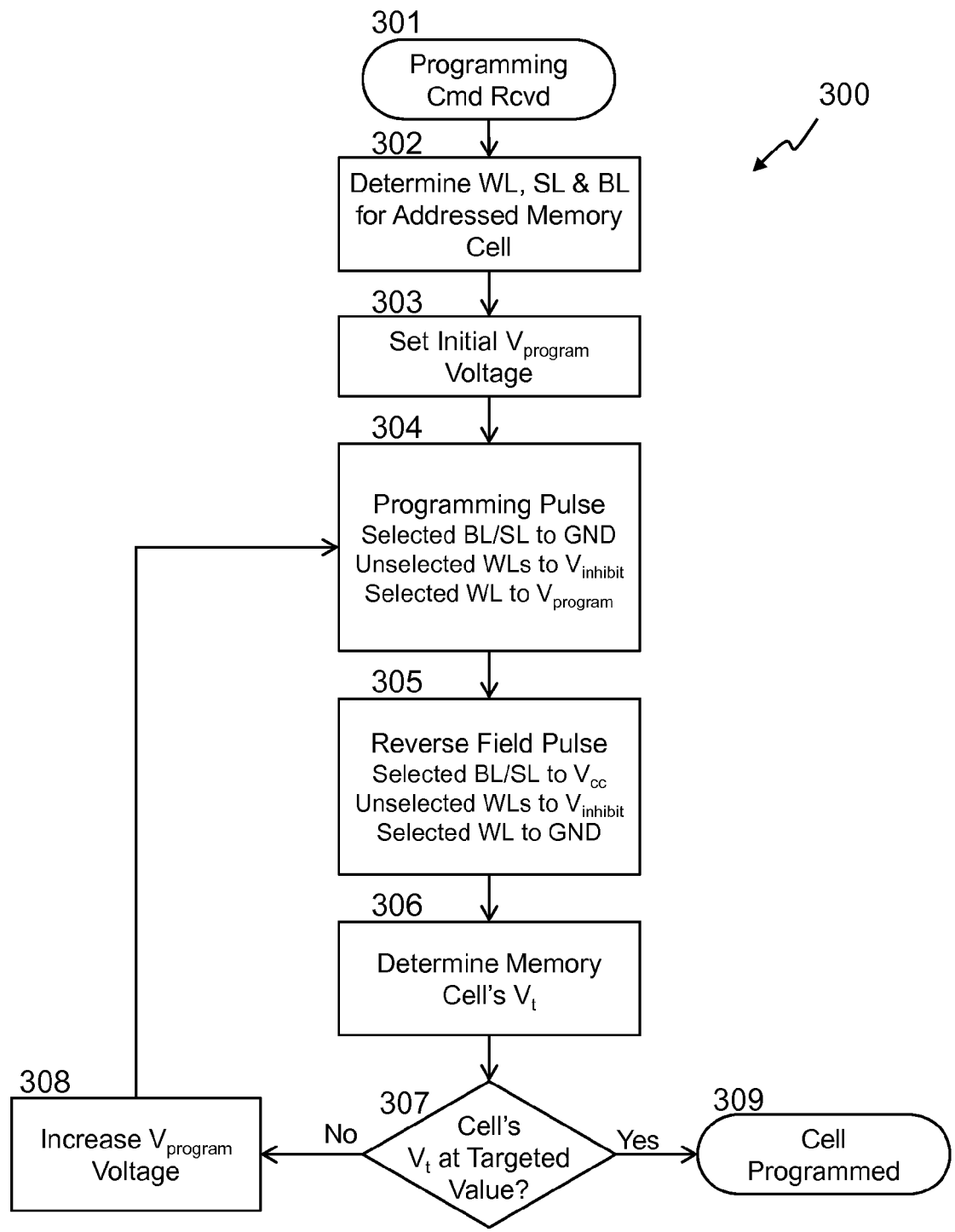
FIG. 3 is a flow diagram of a method to accelerate charge equilibrium in accordance with one or more embodiments.

Referring now to FIG. 3, a flow diagram of a method to accelerate charge equilibrium in accordance with one or more embodiments will be discussed. Although FIG. 3 shows one particular order of the blocks of method 300, it should be noted that the blocks may be arranged in various other orders, including more or fewer blocks than shown in FIG. 3, and the scope of the claimed subject matter is not limited in these respects. FIG. 3 shows a method 300 to program a single memory cell for purposes of discussion. However method 300 may be applied to multiple memory cells and/or multiple memory blocks. In some embodiments, data may be written as a full block or page instead of a single cell, in which case method 300 may be extrapolated from application of method 300 to a single memory cell. A programming command may be received at block 301 from the processor 201 or other controlling element. In response to that command, the address circuitry 212 decodes the address, and in conjunction with the control circuitry 211, determines at block 302 which write line (WL), source line (SL) and bit line (BL) are coupled to the addressed memory cell. The control circuitry 211 sets, at block 303, an initial voltage level that is used for programming, $V_{program}$. In one embodiment, the initial $V_{program}$ level may be about 12 V. In other embodiments the initial $V_{program}$ level may vary widely dependent on many factors that may come into play in a particular embodiment, but many embodiments will set the $V_{program}$ level to a voltage greater than about 2 volts. A programming pulse is then generated at block 304 by grounding the selected bit line and/or source line in one embodiment, and turning on a source select gate and/or drain select gate that may couple the selected bit line and/or source line to the string of memory cells containing the selected memory cell. Other embodiments may apply other voltages to the selected bit line and/or source line, including some embodiments that might use voltages between about 0 volts and about 3 volts. The word lines for the other memory cells in the string, except the word line connected to the selected memory cell, may be set to $V_{inhibit}$, which may be about 10 V in one embodiment. This voltage may be selected to ensure that the other memory cells in the string turn on, allowing the channels of the memory cells in the string to charge to the same potential as the coupled bit line and/or source line, even if the memory cells have been previously programmed to the highest possible $V_t$. Any voltage may be used for $V_{inhibit}$ as long as it turns doesn't change the amount of charge stored on the floating gates of the other memory cells. In some embodiments, $V_{inhibit}$ may be between about 3 volts and about 10 volts, depending on the details of the specific embodiment. The bit line and/or source line for the strings where the selected word line is coupled to a memory cell in that string but that memory cell is not being programmed may be driven with a $V_{cc}$ voltage, which may be about 2.5 V to 3 V in one embodiment and the source select gates and/or drain select gates coupled to those strings turned on. Then, once the channels of the string have been charged to the same potential as the source line and/or bit line, the source select gates and drain select gates may be turned off in the strings that are not being programmed, isolating the channels of those strings in some embodiments. Once the channels are isolated, the $V_{inhibit}$ voltage on the word lines may pull the channels to an even higher potential, up to 6 volts in some embodiments. Then a pulse with a voltage of $V_{program}$ is created on the word line attached to the control gate of the selected memory cell to change the amount of charge stored on the floating gate of the selected memory cell in a string being programmed. This occurs due to the high electric field applied between the control gate of the selected memory cell and the channel of that memory cell which is held at ground. The strings that have isolated their channels are not programmed as there is not a high enough electric field generated on the memory cells in those strings. The programming pulse may be about 10 microseconds in one embodiment, but may be longer or shorter in other embodiments.

Soon after the end of the programming pulse, about another 10 microseconds in one embodiment, a reverse field pulse may be applied at block 305 to the selected memory cell. Since negative voltages are difficult to generate in many modern semiconductor processes and/or because system designers do not want to be required to provide a negative voltage, the reverse field may be created in one or more embodiments without using negative voltages. To accomplish this, the selected bit line and/or source line may be driven with a $V_{cc}$ voltage, which may be about 2.5 V to 3 V in one embodiment. Other embodiments may apply other voltages depending on many different factors and some embodiments may use a voltage level between about 1 volt and about 15 volts. Any suitable voltage level may be used that is less than the voltage level that erases the cell. The word lines connected to the unselected memory cells may be driven with the $V_{inhibit}$ voltage and any source select gate or drain select gate turned on until the channels of the memory cells in that string are charged. Once the channels are charged, the source select gate and drain select gate may be turned off allowing the charge of the channels to remain. In some embodiments, the channels may reach a higher potential than the bit line and source line, in some embodiments the channels may reach 6 volts, due to the higher voltage on their control gates. Once the channels are charged, the reverse field pulse is created by grounding the word line connected to the control gate of the selected memory cell in at least one embodiment. Other embodiments may apply other voltages to the control gate of the selected memory. Any voltage may be used in an embodiment as long as it creates an electric field of reverse polarity from the field created by the programming pulse. In some embodiments the voltage applied to the control gate of the selected memory cell may be between about 0 volts and about 5 volts. In one embodiment, the reverse field pulse is about 10 microseconds but other embodiments may use a shorter or longer pulse.

After the completion of the reverse field pulse, a verify operation is done in many embodiments to determine at block 306 the $V_t$ of the recently programmed memory cell. This may be accomplished by performing a series of operations of the memory cell with various voltages applied to the control gate of the selected memory cell, and determining which $V_t$ levels allow current to flow through the memory cell. Once the $V_t$ of the memory cell is determined at block 306, it may be compared at block 307 to the targeted value for $V_t$ given the bit pattern that is being programmed into the memory cell. If the $V_t$ is not yet high enough, the value for $V_{program}$ may be increased at block 308, wherein in one embodiment the increase may be about 0.5 V, and another set of programming pulse at block 304, reverse field pulse at block 305, determining at block 306 the $V_t$ of the memory cell, and comparing at block 307 it against a target value is performed. The process may be repeated until the targeted $V_t$ value is reached and the cell is considered programmed at block 309. Depending on the details of the specific embodiment, the $V_{program}$ level may need to be quite high to be able to change the charge of the floating gate to the proper levels. Any voltage may be used and some embodiments may utilize a $V_{program}$ level as high as 25-30 volts or even higher. Example programming voltage waveforms are shown in and described with respect to FIG. 4, below.

Figure 4:
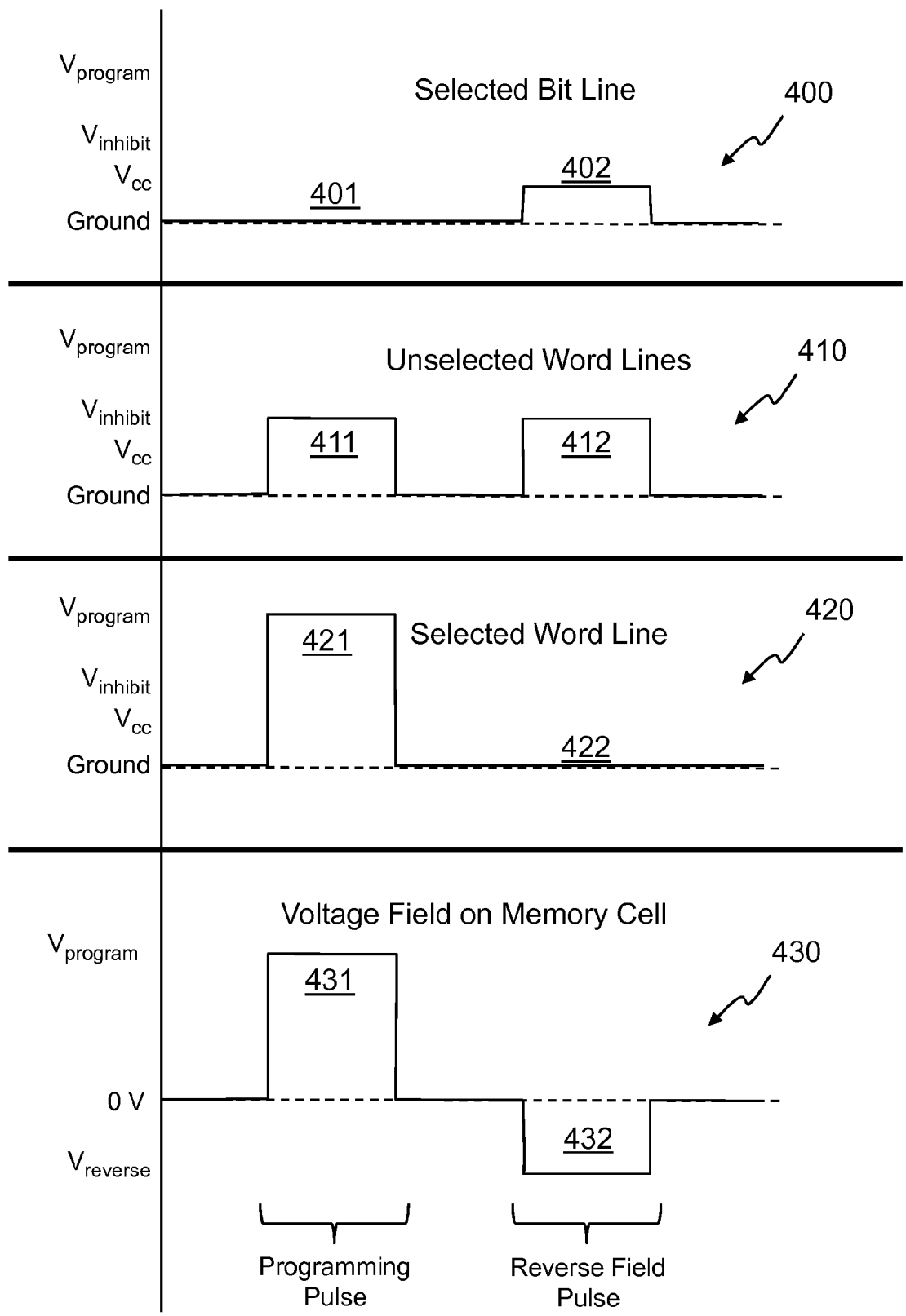
FIG. 4 is a diagram showing voltage waveforms in accordance with one or more embodiments.

Referring now to FIG. 4, a diagram of showing voltage waveforms in accordance with one or more embodiments will be discussed. Voltage waveforms for the programming pulse and reverse field pulse for one embodiment are shown. Waveform 400 illustrates the voltages applied to the bit line and/or source line that is coupled to the selected memory cell. The bit line may be held at ground during the programming pulse 401 and at $V_{cc}$ during the reverse field pulse 402. In embodiments with source select gates and drain select gates, those gates may be turned on for at least some period of time before or at the beginning of the pulses to allow the voltage potential of the bit line and source line to propagate through the string to the cell being programmed. Waveform 410 illustrates the voltages applied to unselected word lines, word lines that are connected to the control gates of the memory cells of the string of memory cells containing the selected memory cell, with the exception of the control gate of the selected memory cell. The unselected word lines may be driven to $V_{inhibit}$ during both the programming pulse 411 and the reverse field pulse 412. In some embodiments, the programming pulse and reverse field pulse may use different values for $V_{inhibit}$. Waveform 420 shows the voltages driven on the word line that is connected to the control gate of the selected memory cell. The selected word line may be driven to $V_{program}$ during the programming pulse 421 and held at ground level during the reverse field pulse 422. It should be noted that the $V_{program}$ voltage may vary from one programming pulse to the next to be able to get the proper amount of charge on the floating gate. Waveform 430 illustrates the voltage field that is created between the control gate and the channel of the selected memory cell. This voltage field may be created as a result of the other waveforms 400, 410, 420 and may not directly measurable on any single control line. During the programming pulse 431, the channel may be at ground while the control gate is at $V_{program}$ so a positive voltage field of $V_{program}$ volts is created from the control gate to the channel. During the reverse field pulse 432, the channel may be charged to a voltage of $V_{cc}$ or higher and the control gate is held at ground creating voltage field of negative $V_{reverse}$ volts from the control gate to the channel of the selected memory cell wherein $V_{reverse}$ has the opposite polarity, but a magnitude between $V_{cc}$ and $V_{inhibit}$. This negative field may be created without using any voltages below ground such that no negative voltages are used, although the scope of the claimed subject matter is not limited in this respect.

Referring now to FIG. 5A and FIG. 5B, diagrams illustrating charge movement between two views of a cross section of a portion of a physical embodiment of the memory array in accordance with one or more embodiments will be discussed. FIG. 5A shows a cross section 500 of a portion of a physical embodiment of the memory array. The silicon (Si) substrate 501 may be "p" doped while the source/drain wells 510, 511, 512, 513 may be "n" doped in some embodiments, although the scope of the claimed subject matter is not limited in this respect. Layers of insulator 517 may be located on top of the silicon with contacts coming through the insulator in some areas. In some embodiments, the insulating material may comprise an oxide. The example shown has a string of three memory cells. The first memory cell comprises a control gate 507, a floating gate, and a channel located between a source 510 and a drain 511. The second memory cell comprises a control gate 508, a floating gate 515, and a channel 516 located between a source 511 and a drain 512. The third memory cell comprising a control gate 509, a floating gate, and a channel located between a source 512 and a drain 513. Adjacent memory cells may share a common n-well for their connected source and drain. The source of the first memory cell may be directly connected to the source line (SL) 502 in this embodiment while a source select gate may be used in other embodiments to couple the source line to the first memory cell. The drain 513 of the third memory cell may be directly connected to the bit line (BL) 506 in this embodiment while in other embodiments a drain select gate may be used to couple the bit line to the memory cell string. Word line 0 (WL0) 503 may be connected to the control gate 507 of the first memory cell, word line 1 (WL1) 504 may be connected to the control gate 508 of the second memory cell and word line 2 (WL2) 505 may be connected to the control gate 509 of the third memory cell. The cross section 500 is a representation of the state of the memory cells immediately after the programming pulse where the channel 516 of the second memory cell was held to ground while $V_{program}$ was applied to the control gate 508.

The programming pulse moves charge to the floating gate 515. However, the programming pulse also moves some excess charge 520 into the insulating layer 518 between the control gate 508 and the floating gate 515. The programming pulse also moves some excess charge 521 into the insulating layer 519 between the channel 516 and the floating gate 515. This excess charge 520, 521 may not be stably held in the insulating layers 518, 519 and may cause the $V_t$ of the memory cell to change somewhat over time as the charge reaches equilibrium if nothing is done to accelerate it. The process wherein the excess charge 520 that is temporarily trapped in the insulating later 518 between the floating gate 515 and the control gate 508 migrates to the floating gate over a period of time may be called Quick Charge Gain (QCG) and the process wherein the excess charge 521 that is temporarily trapped in the insulating layer 519 between the floating gate 515 and the channel 516 migrates to the channel over a period of time may be called Quick Charge Loss (QCL). The reverse field pulse accelerates the movement of the excess charge 520, 521 to equilibrium, accelerating QCG and QCL. The reverse voltage pulse may be created by charging the channel 516 of the second memory cell to a positive voltage and then holding the control gate 508 at ground. This reverse field pulse pushes the excess charge 520 toward the floating gate 515 and the excess charge 521 toward the channel. The reverse field pulse accelerates this process more than 100 times compared to how quickly the charge would move if no reverse field pulse was applied. FIG. 5B shows a cross sectional view 530 of the memory array immediately after the reverse field pulse has been applied to the second memory cell. The excess charge 520 that was trapped in the insulating layer 518 has moved to the floating gate 515 and the excess charge 521 that was trapped in the insulating layer 519 has moved to the channel 516. Once the excess charge has moved to the floating gate 515 or the channel 516, it may be sufficiently stable and sufficient charge equilibrium may be attained.

In one or more alternative embodiments, the memory cells may be programmed as a single level cell (SLC) or multilevel cell (MLC). The threshold voltage ($V_t$) of the cells may be indicative of the data that is stored in the cell. For example, in an SLC, a $V_t$ of 2 V might indicate a programmed cell while a $V_t$ of 0.5 V might indicate an erased cell. The MLC may have multiple $V_t$ ranges that each indicate a different state. Multi-level cells take advantage of the analog nature of a traditional flash cell by assigning a bit pattern to a specific voltage range stored on the cell. This technology permits the storage of two or more bits per cell, depending on the quantity of voltage ranges assigned to the cell, although the scope of the claimed subject matter is not limited in this respect.

Figure 6:
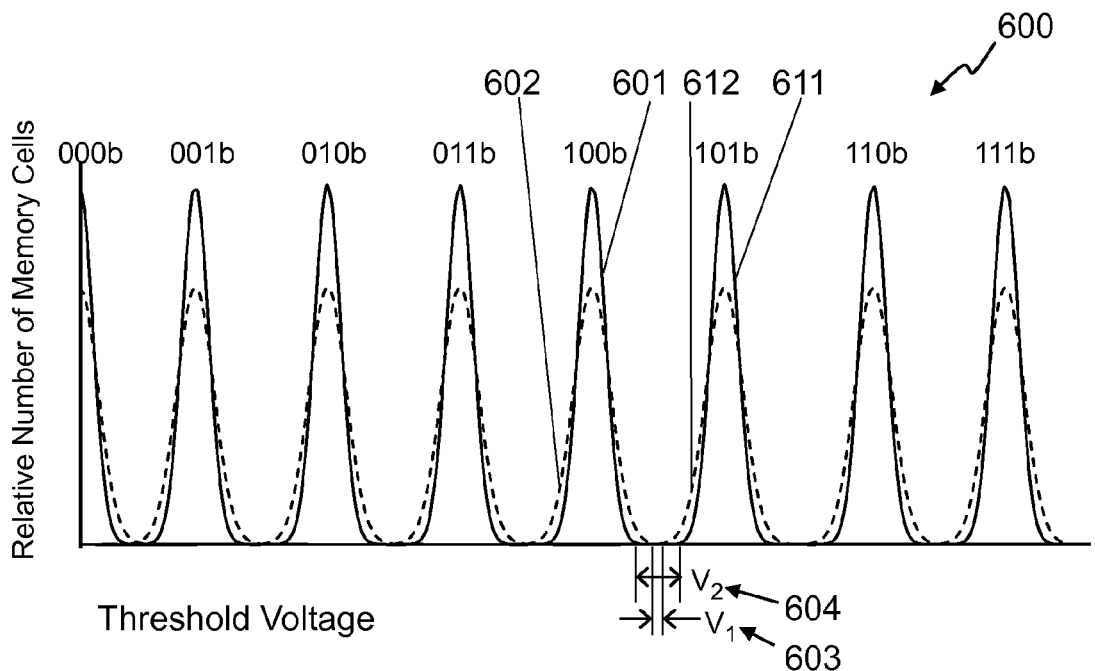
FIG. 6 is a diagram illustrating distributions of threshold voltages of memory cells in accordance with one or more embodiments.

Referring now to FIG. 6, a diagram illustrating distributions of threshold voltages of memory cells in accordance with one or more embodiments will be discussed. FIG. 6 is a graph 600 of threshold voltage distributions for one embodiment of an MLC device that is designed to hold 3 binary bits of information in the memory cells. In such an arrangement, 8 different $V_t$ targets may be defined. In graph 600, the lobes represent the statistical distribution of the memory cells within a device for the cells that are programmed with a target $V_t$ for the bit pattern indicated at the top of a respective lobe. Different embodiments may store a different number of bits per cell such as 2 bits per cell or 4 bits per cell which would then define 4 or 16 different $V_t$ targets, respectively. The x-axis of graph 600 represents threshold voltage $V_t$, and the y-axis represents the relative number of cells that have that particular value $V_t$. The lobes of graph 600 may be interpreted separately as the distribution of cells for one particular bit pattern stored in the MLC. In graph 600, all 8 lobes are shown on the same axis to facilitate an understanding of the relationship between target $V_t$ values. The 000b state represents the erased state of the memory cell, and the other 7 lobes for 7 other $V_t$ values are used to represent the other 7 patterns of 3 bits. In this example, the bit patterns 001b, 010b, 011b, 100b, 101b, 110b, and 111b, an incrementing pattern, are represented by successively larger $V_t$ values, however in other embodiments the bit patterns may be assigned differently. Graph 600 is merely used to illustrate the effect of the reverse field on the relationship between different states of the MLC in accordance with one or more embodiments, and the scope of the claimed subject matter is not limited in this respect.

The lobes of graph 600 representing one state of the MLC are shown with two lines, one dashed line and one solid line. The dashed and solid lines for the lobes are representative of the distribution of $V_t$ just before and just after the reverse field is applied to the memory cell, respectively. Looking now to lobe 100b for illustrative purposes, the solid line 601 is representative of the distribution of $V_t$ after the reverse field is applied to the memory cell and charge equilibrium has been accelerated. The dashed line 602 is representative of the distribution of $V_t$ just before the reverse field is applied to the memory cell. The distribution of $V_t$ just before the reverse field 602 is applied may be a broader distribution, with higher and lower voltages in the distribution for each state, than the distribution of $V_t$ after the reverse field 601 is applied.

To determine the state of the MLC, the cell may be checked with different values of $V_t$ applied to its control gate to see if it turns on. The values for $V_t$ to check for the different states are the $V_t$ values in the gaps between the lobes of graph 600. To differentiate between the 100b state and the 101b state, a $V_t$ that is below where a vast majority of memory cells programmed to be in the 101b state would have their $V_t$ value and above where a vast majority of memory cells programmed to be in the 100b state would have their $V_t$ value would be used to check the MLC. A very small number of cells having their $V_t$ value outside of the range checked may be tolerated by correction using the ECC bits of the memory array. Looking now to graph 600, dashed lines 602, 612 show the distribution of the cells for the 100b and 101b states before the reverse field is applied. If the state were to be checked before the reverse field is applied, a $V_t$ value to differentiate between 100b and 101b in the example would be in the $V_1$ voltage range 603, which is very narrow in this example but could be essentially non-existent in other embodiments. By applying a reverse field to the MLC and narrowing the distribution of $V_t$ as shown by the solid lines 601, 611, the gap between the lobes may be increased to the $V_2$ voltage range 604, thereby increasing the margin in the design and allowing more cells at outer ranges of a statistical distribution to work properly.

Figure 7:
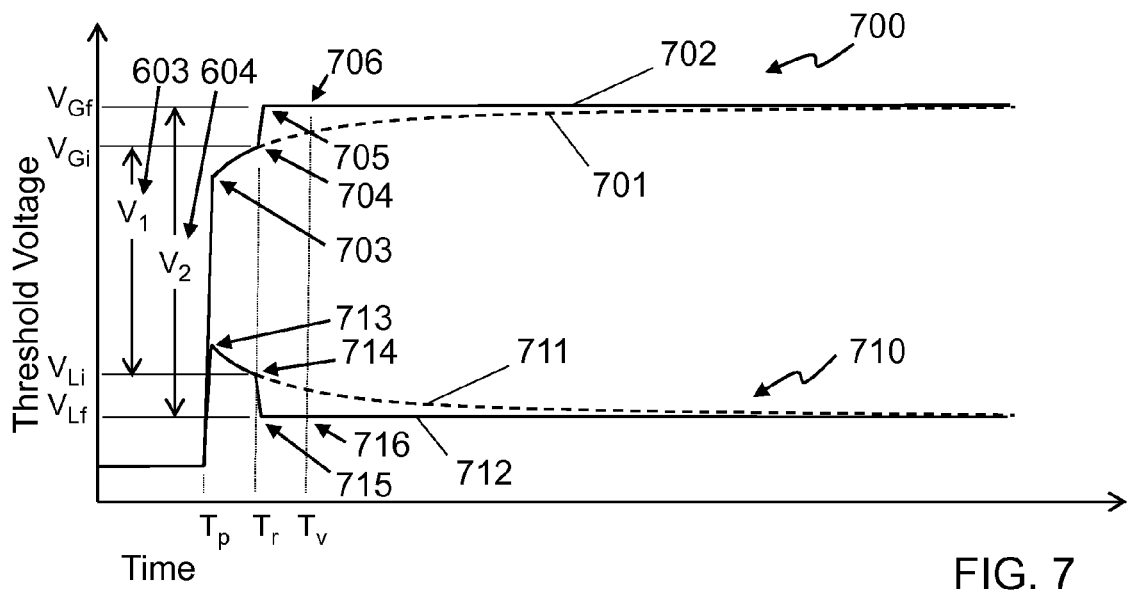
FIG. 7 is a diagram illustrating threshold voltage waveforms over time for embodiments with and without utilizing charge equilibrium acceleration in accordance with one or more embodiments.

Referring now to FIG. 7, a diagram illustrating threshold voltage waveforms over time for embodiments with and without utilizing charge equilibrium acceleration in accordance with one or more embodiments will be discussed. As shown in FIG. 7, graph 710 may be representative of a memory cell that happens to be at the upper end of the distribution for $V_t$ being programmed to the 100b state at time $T_p$. The $V_t$ is pushed to a voltage point 713 but quickly begins to decay due to quick charge loss (QCL) effects. The dashed curve 711 may be representative of how the $V_t$ would decay over time if no reverse field pulse was applied. The solid line 712 may be representative of how the $V_t$ reacts if the present subject matter is used. Applying a reverse field pulse at time $T_r$ causes the $V_t$ to fall rapidly from $V_{Li}$ 714 to $V_{Lf}$ 715. Then as a verify operation is started at time $T_v$ 716, the charge on the floating gate is been accelerated to equilibrium, so $V_t$ is sufficiently stable.

Graph 700 may be representative of a memory cell that happens to be at the lower end of the distribution for $V_t$ being programmed to the 101b state at time $T_p$. The $V_t$ is pushed to a voltage point 703 but quickly begins to rise due to quick charge gain (QCG). The dashed curve 701 may be representative of how the $V_t$ would rise over time if no reverse field pulse was applied. The solid line 702 may be representative of how the $V_t$ reacts if the present subject matter is used. Applying a reverse field pulse at time $T_r$ causes the $V_t$ to rise rapidly from $V_{Gi}$ 704 to $V_{Gf}$ 705. Then as a verify operation is started at time $T_v$ 706, the charge on the floating gate has been accelerated to or near equilibrium, so $V_t$ may be sufficiently stable. If a device did not implement a reverse field pulse, a verify operation may be started at time $T_r$, and the device may be built so that the difference between the $V_t$ for the two states at that time, $V_1$ 603, could be accommodated. By applying the reverse field pulse before verifying, the difference between $V_t$ for the two states at charge equilibrium, $V_2$ 604, may be used. A larger voltage gap between states allows for more margin in the design, thereby increasing yields. Alternatively, a design may utilize the tighter distribution of $V_t$ for each state to try to pack more states in to a given range of $V_t$ to give more bits of storage per cell. A device that does not use a reverse field pulse to accelerate charge equilibrium may either live with the broader $V_t$ distributions or wait longer than 1 ms for the charge to reach equilibrium on its own before verifying, making the programming process nearly 100 times longer.

In verifying experiments, the effect of the reverse field pulse in the area of quick charge gain was particularly pronounced, moving the upper edge of the $V_t$ distribution of some states by over 50 mV in some experiments. Overall, taking acceleration of both QCG and QCL into account, experimentation has shown an average decrease of over 25 mV, or approximately 5%, in the width of the $V_t$ distributions for the 8 different states in one embodiment of a 3 bit per cell MLC NAND design. However, this is merely one example of the application of charge equilibrium acceleration in a floating gate memory device via a reverse field pulse, and the scope of the claimed subject matter is not limited in this respect.

Although the claimed subject matter has been described with a certain degree of particularity, it should be recognized that elements thereof may be altered by persons skilled in the art without departing from the spirit and/or scope of claimed subject matter. It is believed that the subject matter pertaining to charge equilibrium acceleration in a floating gate memory device via a reverse field pulse and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method for accelerating charge equilibrium in a memory device, the method comprising:
applying an electric field to a selected memory cell to change an amount of charge stored on a charge storage element in the selected memory cell; and
reversing the electric field on the selected memory cell without applying a negative voltage with respect to ground to the selected memory cell;
wherein said reversing the electric field accelerates equilibrium of the charge stored on the memory cell prior to a program verify operation.

2. The method of claim 1, wherein said electric field to change the amount of charge stored on the charge storage element is applied for less than about 20 microseconds and the electric field is reversed for less than about 20 microseconds before a verification of the selected memory cell occurs.

3. The method of claim 1, wherein said reversing the electric field on the selected memory cell comprises:
generating a positive voltage in a channel of the selected memory cell; and
applying a voltage to a control gate of the selected memory cell that is lower than the voltage generated in the channel, but not less than about 0 volts.

4. The method of claim 1, wherein:
said applying the electric field to the selected memory cell comprises applying a first voltage to a bit line coupled to the selected memory cell and applying a second voltage to a word line coupled to the selected memory cell, the second voltage enough higher than the first voltage to change the amount of charge stored on the charge storage element in the selected memory cell; and
said reversing the electric field on the selected memory cell comprises applying a third voltage to the word line and applying a fourth voltage to the bit line, the fourth voltage enough higher than the third voltage to force electrons from an oxide layer but not so high as to force charge stored on the charge storage element in selected memory cell through the oxide layer.

5. The method of claim 1, wherein:
said applying the electric field to the selected memory cell comprises applying a voltage of between about 0 volts and about 3 volts to a bit line coupled to the selected memory cell and applying a voltage greater than about 2 volts to a word line coupled to the selected memory; and
said reversing the electric field on the selected memory cell comprises applying a voltage of between about 1 volt and about 15 volts to the bit line and applying a voltage of between about 0 volts and about 5 volt to the word line.

6. A memory device comprising:
a memory array comprising a plurality of memory cells; and
control circuitry coupled to the memory array, the control circuitry to control a programming operation of the plurality of memory cells and being arranged to:
(a) apply an electric field to a selected memory cell with a programming pulse at a programming voltage;
(b) reverse the electric field on the selected memory cell using only voltages greater than or equal to about 0 volts; and
(c) verify the content of the selected memory cell to determine if the selected memory cell is successfully programmed subsequent to reversing the electric field on the selected memory cell.

7. The memory device of claim 6, wherein the memory array is organized in a NAND architecture.

8. The memory device of claim 6, the selected memory cell comprising a floating gate capable of storing an amount of charge, wherein more than a single binary bit of information can be stored in the selected memory cell via control of the amount of charge stored on the floating gate.

9. The memory device of claim 8, wherein the selected memory cell stores 3 binary bits of information via storing one of 6 different amounts of charge on the floating gate.

10. The memory device of claim 6, the selected memory cell comprising a control gate and a channel, wherein the control circuitry is further arranged to:
generate a positive voltage in the channel; and
apply a voltage to the control gate that is lower than the voltage generated in the channel, but not less than about 0 volts.

11. The memory device of claim 6, the selected memory cell comprising a control gate, and a channel, wherein the control gate is coupled to a word line and the channel is coupled to a bit line;
wherein the control circuitry is arranged to drive a first voltage onto the bit line and drives a second voltage onto the word line to apply the electric field to the selected memory cell with the programming pulse, the second voltage being sufficiently higher than the first voltage to change an amount of charge stored on a charge storage element of the selected memory cell; and
the control circuitry is arranged to drive a third voltage onto the word line and drive a fourth voltage onto the bit line in order to reverse the electric field on the selected memory cell, the fourth voltage being sufficiently higher than the third voltage to force electrons from an oxide layer but not so high as to force charge stored on the charge storage element in selected memory cell through the oxide layer.

12. The memory device of claim 6, the selected memory cell comprising a control gate, and a channel, wherein the control gate is coupled to a word line and the channel is coupled to a bit line;
wherein the control circuitry is arranged to drive a voltage of about 0 volts onto the bit line and drives a voltage of between about 10 volts and about 25 volts onto the word line to apply the electric field to the selected memory cell with the programming pulse; and
the control circuitry is arranged to drive a voltage of between about 2 volts and about 5 volts onto the word line and drives a voltage of about 0 volts onto the bit line to reverse the electric field on the selected memory cell.

13. The memory device of claim 6 wherein, if it is determined that the selected memory cell has not been successfully programmed, the control circuitry is arranged to repeat said (a), (b), and (c), until it is determined that the selected memory cell has been successfully programmed;

wherein the programming voltage is incrementally increased prior to one or more repetition.

14. The memory device of claim 7, the memory array further comprising:

a string of memory cells comprising the selected memory cell coupled to one or more other memory cells, the string of memory cells having a source end and a drain end, a selected word line coupled to the selected memory cell;

one or more other word lines coupled to the one or more other memory cells;

a bit line coupled to the drain end of the string of memory cells a source line coupled to the source end of the string of memory cells;

the control circuitry being further arranged to:

apply an inhibiting voltage to the one or more other word lines, the inhibiting voltage being sufficiently large to allow a current to flow through the one or more other memory cells but not large enough to program the one or more other memory cells;

apply the electric field to the selected memory cell with a programming pulse at a programming voltage by applying a first voltage to the bit line, a second voltage to the source line, and a third voltage to the selected word line, the third voltage enough higher than the first and the second voltages to program the selected memory cell; and reverse the electric field on the selected memory cell via application of a fourth voltage to the bit line, a fifth voltage to the source line, and a sixth voltage to the selected word line, the fourth and fifth voltages being sufficiently higher than the sixth voltage to accelerate charge equilibrium in the selected memory cell but not high enough to erase the selected memory cell.

15. The method of claim 14 wherein;

the first, second and sixth voltages are about 0 volts;

the third voltage is between about 10 volts and about 30 volts;

the inhibiting voltage is between about 3 volts and about 10 volts; and the fourth and fifth voltages are between about 2 volts and about 10 volts.

16. A storage system comprising:

a processor to generate memory control commands; and at least one non-volatile memory device coupled to the processor to operate in response to the memory control commands, the at least one memory device comprising:

a memory array comprising two or more memory cells, the memory cells comprising a control gate, a floating gate and a channel; and control circuitry coupled to the memory array to control operation of the memory array in response to the memory control commands, the control circuitry being arranged to:

(a) receive a program command from the processor;

(b) apply an electric field to a selected memory cell with a programming pulse at a programming voltage;

(c) reverse the electric field of the selected memory cell by generating a positive voltage in the channel of the selected memory cell and applying a voltage to the control gate of the selected memory cell that is lower than the voltage generated in the channel, but not lower than about 0 volts;

(d) verify the content of the selected memory cell to determine if the selected memory cell is successfully programmed subsequent to reversing the electrical field on the selected memory cell; and if the selected memory cell is not yet successfully programmed, the control circuitry to repeat said (b), (c) and (d) until it is determined that the selected memory cell has been successfully programmed;

wherein the programming voltage is incrementally increased prior to one or more repetition.

17. The storage system of claim 16, wherein one or more of the memory cells is capable of storing more than one binary bit of information.

18. The storage system of claim 16, the memory control commands comprising a read command, a write command and an erase command;

the memory control commands being communicated from the processor to the control circuitry via an electrical connection.

19. The storage system of claim 16, further comprising external connections, the external connections communicatively coupled to the processor;

wherein the processor is arranged to receive write commands and write data through the external connections and stores the write data in the at least one non-volatile memory device; and the processor is arranged to receive read commands from the external connections, retrieve read data from the at least one non-volatile memory device, and send the read data through the external connections.

20. The storage system of claim 19, wherein the external connections are compliant with a communication protocol.

* * * * *